United States Patent

Takatsu

Patent Number: 5,221,866
Date of Patent: Jun. 22, 1993

[54] SEQUENTIAL LOGIC CIRCUIT HAVING STATE HOLD CIRCUITS

[75] Inventor: Motomu Takatsu, Kawasaki, Japan

[73] Assignee: Fujitsu Limited, Kawasaki, Japan

[21] Appl. No.: 797,929

[22] Filed: Nov. 26, 1991

[30] Foreign Application Priority Data

Nov. 28, 1990 [JP] Japan ................ 2-327078

[51] Int. Cl.[5] .......................................... H03K 19/173
[52] U.S. Cl. .................................... 307/465; 307/480; 307/272.2
[58] Field of Search ............ 307/465, 466, 480, 272.2; 357/4, 12, 16; 377/80, 106, 118, 119, 122, 127

[56] References Cited

U.S. PATENT DOCUMENTS 3,631,260 12/1971 Yoshino ............................. 377/106
4,348,597 9/1982 Weber .................................. 377/80
5,015,874 5/1991 Takatsu ........................... 307/272.1

FOREIGN PATENT DOCUMENTS 0255698 2/1988 European Pat. Off. .
0388529 9/1990 European Pat. Off. .
2-246609 10/1990 Japan .
3-117208 5/1991 Japan ............................... 307/272.2

Primary Examiner—David R. Hudspeth
Assistant Examiner—Jon Santamauro
Attorney, Agent, or Firm—Staas & Halsey

[57] ABSTRACT

A sequential logic circuit includes first, second and third state hold circuits, each having a first input terminal, a second input terminal and an output terminal. The first input terminal of the first state hold circuit receives a clock signal, and the second input terminal of the first state hold circuit and the first input terminal of the second state hold circuit receive a data signal. The second input terminal of the second state hold circuit receives an inverted clock signal corresponding to an inverted version of the clock signal. The output terminal of the first state hold circuit and the output terminal of the second state hold circuit are connected to the first and second input terminals of the third state hold circuit, respectively. An output signal of the sequential logic circuit is output via the output terminal of the third state hold circuit. Each of the first, second and third state hold circuits has the following truth table:

| A | B | $Q_{n-1}$ |
|---|---|-----------|
| 0 | 0 | 1 or 0 |
| 0 | 1 | $Q_n$ |
| 1 | 0 | $Q_n$ |
| 1 | 1 | 0 or 1 | where A and B are signals applied to the first and second input terminals, respectively, and $Q_n$ and $Q_{n+1}$ are the signals obtained at the output terminal. The sequential logic circuit inputs the data signal only when the clock signal changes.

15 Claims, 8 Drawing Sheets

| A | B | $\overline{Q_{n+1}}$ |
|---|---|---|
| 0 | 0 | 1 |
| 0 | 1 | $\overline{Q_n}$ |
| 1 | 0 | $\overline{Q_n}$ |
| 1 | 1 | 0 |

SEQUENTIAL LOGIC CIRCUIT HAVING STATE HOLD CIRCUITS

BACKGROUND OF THE INVENTION

1. Field of the Invention

The present invention generally relates to sequential logic circuits and, more particularly, to a sequential logic circuit which includes state holding (or "hold") circuits.

2. Description of the Prior Art

Digital logic circuits are categorized as being either a combination logic circuit or a sequential logic circuit. The combination logic circuit generates an output signal which is defined by only the current state of an input signal. The sequential logic circuit generates an output signal which is defined by not only the current state of the input signal but also the previous state thereof. A basic circuit necessary to configure the sequential logic circuit is composed of a latch circuit and a flip-flop. A flip-flop can be formed by two latch circuits.

The flip-flop is categorized as being either a master-slave type flip-flop or an edge triggered type flip-flop. The master-slave type flip-flop is formed with a combination of two latch circuits. The edge triggered type flip-flop inputs an input signal only when a clock signal changes. Generally, it is easy to use the edge triggered type flip-flop, as compared with the master-slave type flip-flop, because the edge triggered flip-flop can be used in a relaxed condition as compared with the master-slave type flip-flop.

Normally, it is necessary to use a large number of normal bipolar transistors in order to configure the edge triggered type flip-flop by using latch circuits and gate circuits. However, it is disadvantageous to use a large number of bipolar transistors in light of integration density and operation speed considerations.

As is well known, an element having a hysteresis characteristic is capable of holding the state of a signal. In principle, a single transistor having a hysteresis characteristic has the inherent function of holding the state of a signal. However, it is impossible to form the sequential logic circuit by simply connecting transistors having hysteresis characteristics without taking into account a clock signal control procedure and an arrangement for outputting an output signal.

SUMMARY OF THE INVENTION

It is a general object of the present invention to provide a sequential logic circuit in which the above disadvantages are eliminated.

A more specific object of the present invention is to provide a sequential logic circuit formed with a small number of transistors.

The above objects of the present invention are achieved by a sequential logic circuit comprising first, second and third state hold circuits, each having a first input terminal, a second input terminal and an output terminal, the first input terminal of the first state hold circuit receiving a clock signal, the second input terminal of the first state hold circuit and the first input terminal of the second state hold circuit receiving a data signal, the second input terminal of the second state hold circuit receiving an inverted clock signal corresponding to an inverted version of the clock signal, the output terminal of the first state hold circuit and the output terminal of the second state hold circuit being connected to the first and second input terminals of the third state hold circuit, respectively, an output signal of the sequential logic circuit being output via the output terminal of the third state hold circuit; and each of the first, second and third state hold circuits having the following truth table:

| A | B | $Q_{n+1}$ |
|---|---|---|
| 0 | 0 | 1 or 0 |
| 0 | 1 | $Q_n$ |
| 1 | 0 | $Q_n$ |
| 1 | 1 | 0 or 1 | where A and B are signals applied to the first and second input terminals, respectively, and $Q_n$ and $Q_{n+1}$ are respectively signals obtained at the output terminal, the sequential logic circuit inputting the data signal only when the clock signal changes.

The above objects of the present invention are also achieved by a sequential logic circuit comprising first, second and third state hold circuits, each having N input terminals where N is an integer, and an output terminal, N input signals being respectively applied to the N input terminals, and each of the first, second and third state hold circuits generating a first-level output signal when the number of predetermined-logic-level input signals among the N input signals is smaller than a threshold value N1; generating a second-level output signal when the number of predetermined-logic-level input signals among the N input signals is larger than a threshold value N2; and holding a previous logic state of the output signal when the number of predetermined-logic-level input signals among the N input signals is between the threshold values N1 and N2 where $0 < N1 \leq N2 < N$, and wherein: two of the N input terminals of the first state hold circuit receive a clock signal and a data signal, respectively; two of the N input terminals of the second state hold circuit receive an inverted version of the clock signal and the data signal, respectively; (N−2) of the N input terminals of the first state hold circuit receive first control signals; (N−2) of the N input terminals of the second state hold circuit receive second control signals; two of the N input terminals of the third state hold circuit are connected to the output terminals of the first and second state hold circuits; (N−2) of the N input terminals of the third state hold circuit receive third control signals; and an output signal of the sequential logic circuit is output via the output terminal of the third state hold circuit.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1A:
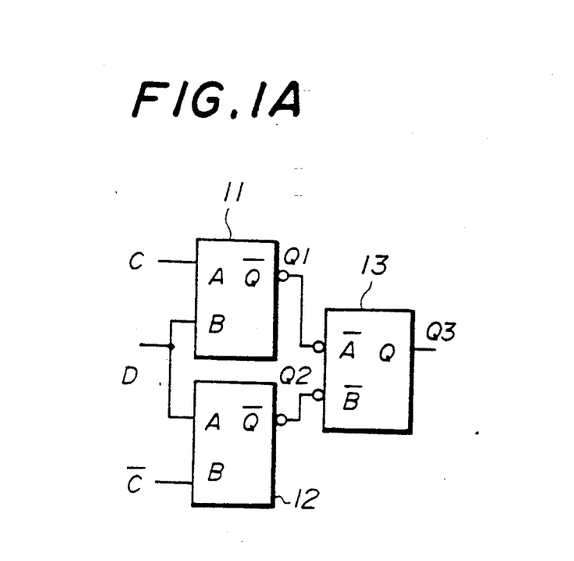
FIG. 1A is a block diagram of a first preferred embodiment of the present invention.
Figure 1B:
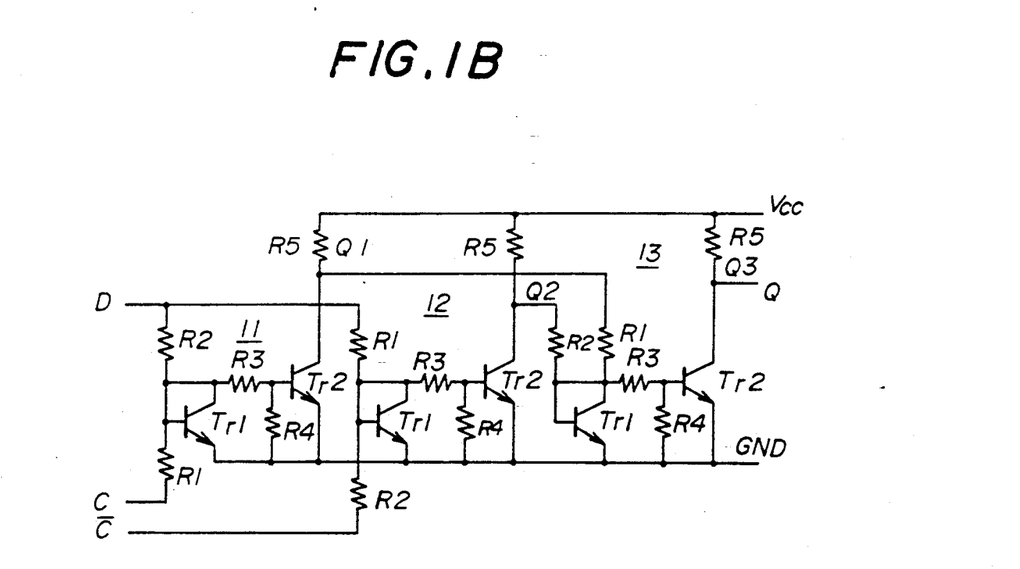
FIG. 1B is a circuit diagram of the first preferred embodiment of the present invention.

FIG. 1A is a block diagram of a sequential logic circuit according to a first preferred embodiment of the present invention, and FIG. 1B is a circuit diagram of the sequential logic circuit shown in FIG. 1A. The first preferred embodiment of the present invention functions as an edge triggered type flip-flop using inverted-output type, two-input, state hold circuits.

First, a description will be given of an inverted-output type, two-input, state hold circuit with reference to FIG. 2A. An inverted-output type two-input state hold circuit 10 shown in FIG. 2A has two input terminals A and B and an inverted output terminal /Q (which corresponds to $\overline{Q}$ in the figures). FIG. 2B shows a truth table of the state hold circuit 10 shown in FIG. 2A. The state of an output signal /Q of the state hold circuit 10 is maintained when an input signal A applied to the input terminal A has a low level ("0") and an input signal B applied to the input terminal B has a high level ("1") or when the input signal A has the high level and the input signal B has the low level. The output signal /Q has the high level when both the input signals A and B have the low levels. The output signal /Q has a low level when both the input signals A and B have the high levels.

Figure 2A:
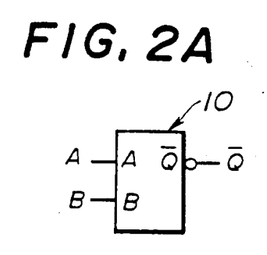
FIGS. 2A, 2B, 2C, 2D, 2E and 2F are diagrams showing a state hold circuit used in the present invention.
Figure 2B:
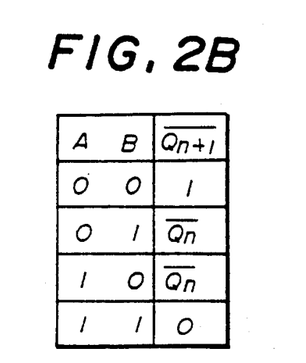
Figure 2C:
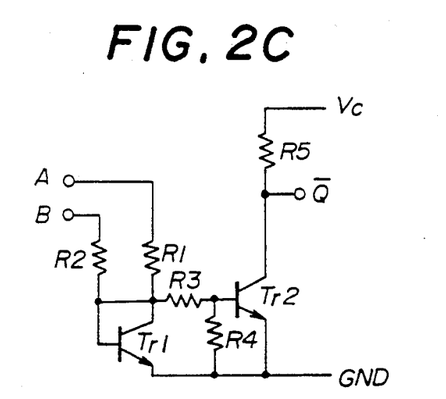

FIG. 2C is a circuit diagram of the state hold circuit 10 shown in FIG. 2A. The state hold circuit 10 has two resonant-tunneling hot electron transistors (RHETs) Tr1 and Tr2. As is well known, an RHET has a negative conductance. The state hold circuit 10 holds the logic state by using the negative conductance of the transistor Tr1.

Figure 2D:
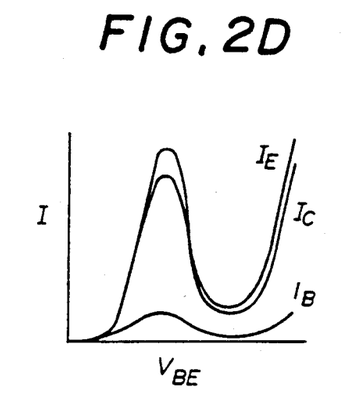

FIG. 2D is a graph showing changes in an emitter current $I_E$, a collector current $I_C$ and a base current $I_B$ as a function of a base-emitter volta $V_{BE}$ of the RHET. When the base-emitter volta $V_{BE}$ has a certain value, the number of electrons introduced into the base from the emitter increases. Electrons introduced in the base become hot electrons, which pass through the base and reach the collector except for some electrons from which energy is lost due to scattering.

Referring again to FIG. 2C, the base of the transistor Tr1 is connected to its collector. The input terminal A is coupled, via a resistor R1, to a common node where the base and collector of the transistor Tr1 are mutually connected. The input terminal B is coupled to the common node via a resistor R2. The base of the transistor Tr2 is connected to the common node via a resistor R3. A resistor R4 is connected between the base and emitter of the transistor Tr2. The collector of the transistor Tr2 is connected to the output terminal /Q, and connected, via a resistor R5, to a high-potential side power supply line Vc. The emitter of the transistor Tr1 and the emitter of the transistor Tr2 are connected to a low-potential side power supply line GND.

Since the transistor Tr1 has the base and the collector thereof connected to each other, it functions as a diode having a characteristic shown in FIG. 2D. It will be noted that a diode having the characteristic shown in FIG. 2D can be substituted for the transistor Tr1. Assuming now that an output resistance of a previous-stage circuit does not change, for the sake of simplicity, the circuit shown in FIG. 2C has an equivalent circuit in which a voltage source, generating an intermediate level between the input signals A and B, is coupled to the diode via a resistor having a parallel resistance of the resistors R1 and R2.

Figure 2E:
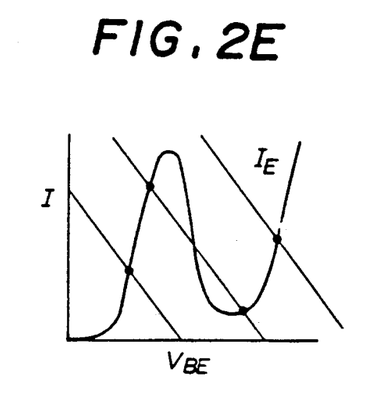

The levels of the input signals A and B and the resistance values of the resistors R1 and R2 are determined as follows. As shown in FIG. 2E, a single stable point exists before the peak of a characteristic curve when both the input signals A and B are at the low level. When one of the input signals A and B is at the high level and the other input signal is at the low level, two stable points exist. A single stable point exists after the peak of the characteristic curve when both the input signals A and B at the high level.

By suitably determining the levels of the input signals A and B and the resistance values of the resistors R1 and R2, the state hold circuit 10 shown in FIG. 2C operates as follows. When the input signals A and B are at the low level, the output signal of the transistor Tr1 has a voltage lower than the peak voltage. When one of the input signals A and B is at the low level and the other input signal is at the high level, the output signal has a low voltage if the previous state of the output signal has the low voltage, and has a high voltage if the previous state has the high voltage. The output signal has a voltage higher than the valley voltage if the input signals A and B are at the high level. Hence, it becomes possible to hold the logic state by designing the circuit so that the operation point is in the hysteresis range only when one of the input signals A and B is at the low level and the other input signal is at the high level.

It will be noted that the transistor Tr1 does not generate a sufficient voltage change in the output signal. The transistor Tr2 amplifies the output signal of the transistor Tr1. The transistor Tr2, which has a negative conductance, is designed so that it operates in a voltage range lower than the negative conductance range. In principle, the transistor Tr2 can be a normal bipolar transistor which has a positive conductance.

Returning to FIG. 1A, the sequential logic circuit is composed of three inverted-output type, two-input state hold circuits 11, 12 and 13. A clock signal C is applied to the input terminal A of the state hold circuit 11, and a data signal D is applied to the input terminal B thereof. The data signal D is also input to the input terminal A of the state hold circuit 12, and an inverted clock signal /C (inverted version of the clock signal C) is input to the input terminal B thereof. The output terminal /Q of the state hold circuit 11 is connected to the input terminal A of the state hold circuit 13, and the output terminal /Q of the state hold circuit 12 is connected to the input terminal B of the state hold circuit 13. It will be noted that the function of the symbol denoting the state hold circuit 13 is the same as that of the symbol denoting each of the state hold circuits 11 and 12.

Referring to FIG. 1B, the base of the transistor Tr1 of the state hold circuit 11 receives the data signal D via the resistor R2, and the base of the transistor Tr1 of the state hold circuit 12 receives the data signal D via the resistor R1. The clock signal C is applied to the base of the transistor Tr1 of the state hold circuit 11 via the resistor R1, and the inverted clock signal /C is applied to the base of the transistor Tr1 of the state hold circuit 12 via the resistor R2. The data signal D is also applied to the base of the transistor Tr1 of the state hold circuit 12 via the resistor R1. The collector of the transistor Tr2 of the state hold circuit 11 is coupled to the base of the transistor Tr1 of the state hold circuit 13 via the resistor R1. The collector of the transistor Tr2 of the state hold circuit 12 is coupled to the base of the transistor Tr1 of the state hold circuit 13 via the resistor R2.

A description will now be given of the operation of the sequential logic circuit shown in FIGS. 1A and 1B with reference to FIGS. 3A through 3F and FIG. 4. Initially, each of the state hold circuits 11-13 holds the high level ("1") or the low level ("0"). If the level of the clock signal C is low (the level of the inverted clock signal /C is high) and the level of the data signal D is high, the state hold circuit 11 holds the previous state, and the output signal Q2 of the state hold circuit 12 switches to the low level because both the input signals A and B have the high levels.

Figure 3A:
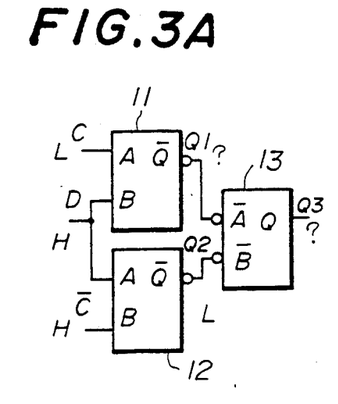
FIGS. 3A, 3B, 3C, 3D, 3E and 3F are block diagrams showing the operation of the first preferred embodiment of the present invention.
Figure 3B:
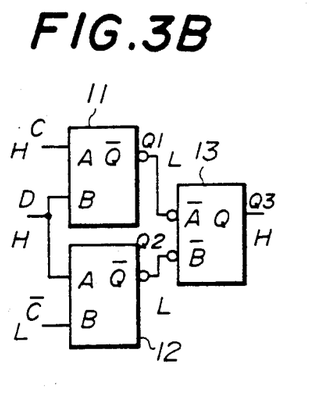

As shown in FIG. 3B, if the clock signal C switches to the high level while the data signal D is maintained at the high level, both the input signals A and B of the state hold circuit 11 become the high levels, and the output signal Q1 thereof switches to the low level. The state hold circuit 12 holds the previous state and continuously generates the low-level output signal Q2. Since both the input signals A and B of the state hold circuit 13 become the low levels, the output signal Q3 thereof switches to the high level, so that the data signal D obtained when the clock signal C rises can be output via the output terminal Q.

Figure 3C:
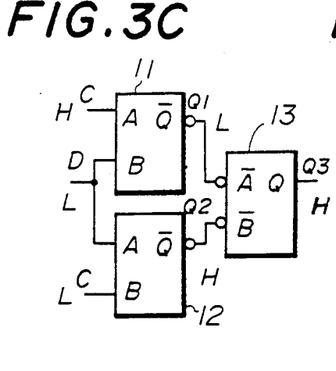

As shown in FIG. 3C, if the clock signal C does not change and is still maintained at the high level even if the data signal D switches to the low level, the output signal Q3 of the state hold circuit Q3 does not change. That is, the state hold circuit 13 holds the previous state even if the data signal D switches to the low level, both the input signals A and B of the state hold circuit 12 become the low level, and thus the output signal Q2 switches to the high level, because either the input terminal /A or /B of the state hold circuit 13 has the low level and the other input terminal has the high level.

Figure 3D:
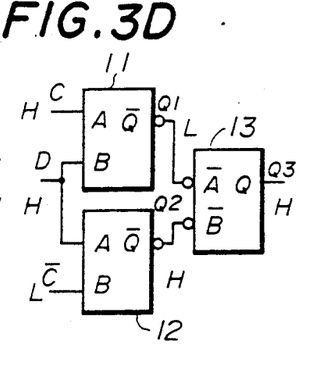

As shown in FIG. 3D, if the data signal D switches to the high level, the output signal Q3 does not change since the clock signal C does not change. That is, the state hold circuit 13 outputs the previous state even if the data signal D switches to the high level, both the input signals of the state hold circuit 11 become the high levels, and thus the output signal Q1 switches to the low level, because one of the two input signals A and B of the state hold circuit 13 has the low level and the other input terminal has the high level.

Figure 3E:
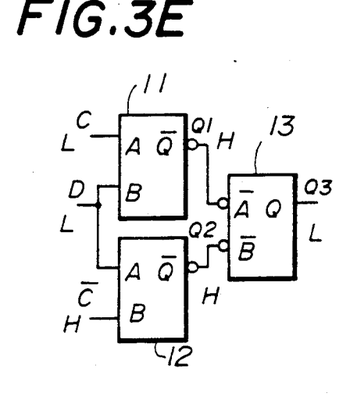

As shown in FIG. 3E, if the clock signal C switches to the low level while the data signal D is maintained at the low level, both the input signals A and B of the state hold circuit 11 become the low levels, and hence the output signal Q1 switches to the high level. The state hold circuit 12 holds the previous state, and outputs the high-level output signal Q2. Then, both the input signals of the state hold circuit 13 become the high levels and thus the output signal Q3 thereof switches to the low level. Hence, the state hold circuit 13 outputs the data signal D obtained when the clock signal C falls.

Figure 3F:
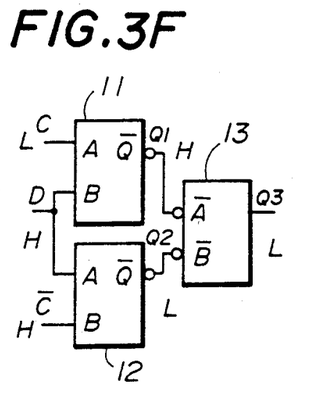
Figure 4:
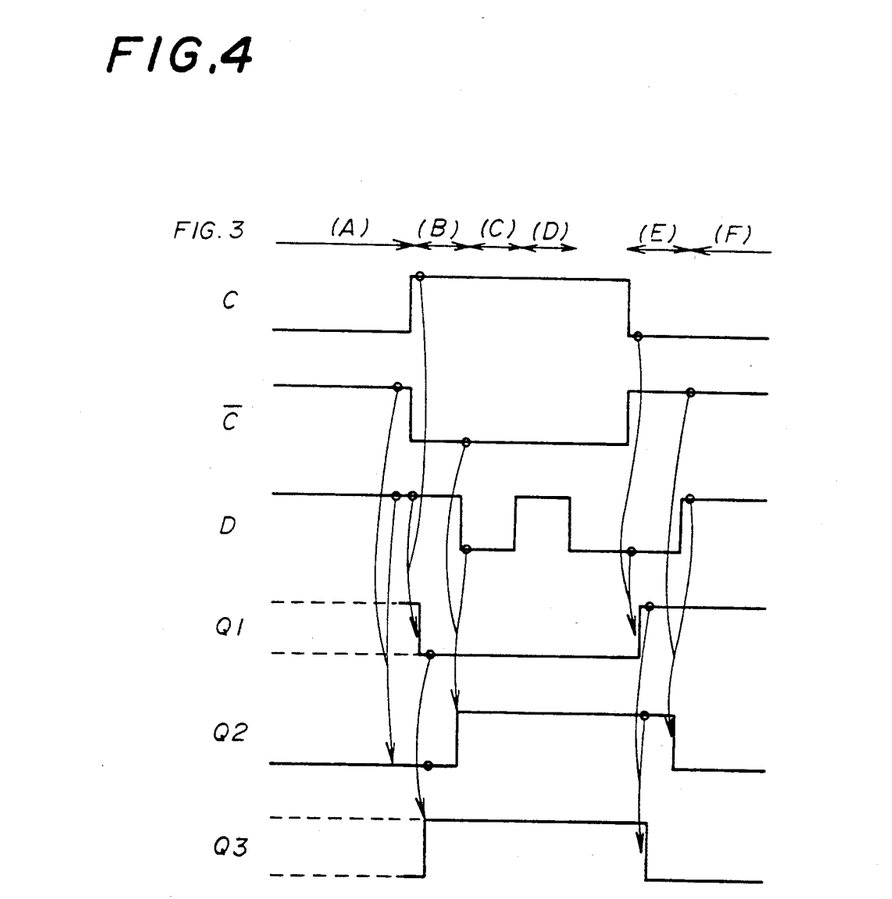
FIG. 4 is a waveform diagram showing the operation of the first preferred embodiment of the present invention.

As shown in FIG. 3F, if the clock signal C does not change and is maintained at the low level and even if the data signal D switches to the high level, the output signal Q3 of the state hold circuit 13 does not change. The state hold circuit 13 holds the previous state and continuously outputs the low-level output signal Q3 even if both the input signals of the state hold circuit 12 become the high levels and the output signal Q2 switches to the low level, because the one of the input signals of the state hold circuit 13 has the high level and the other input signal has the low level.

The data signal D is input in the same manner as described above when the clock signal C switches to the low level from the high level while the data signal D has the high level, or when the clock signal C switches to the high level from the low level while the data signal D has the low level. The output signal of the state hold circuit 13, that is, the output signal of the sequential logic circuit, is maintained until the clock signal C changes.

As described above, the sequential logic circuit shown in FIGS. 1A and 1B functions as an edge triggered type flip-flop in which the data signal D is input only when the clock signal C changes and is not input in other cases even if the data signal D changes.

Figure 5:
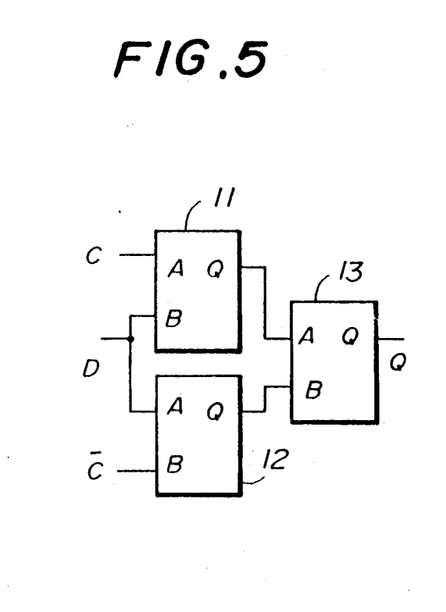
FIG. 5 is a block diagram of a variation of the first embodiment of the present invention shown in FIG. 1A.

FIG. 5 is a variation of the first embodiment of the present invention. In the variation, non-inverted-output type, two-input state hold circuits are used instead of the inverted-output type two-input state hold circuits.

Figure 2F:
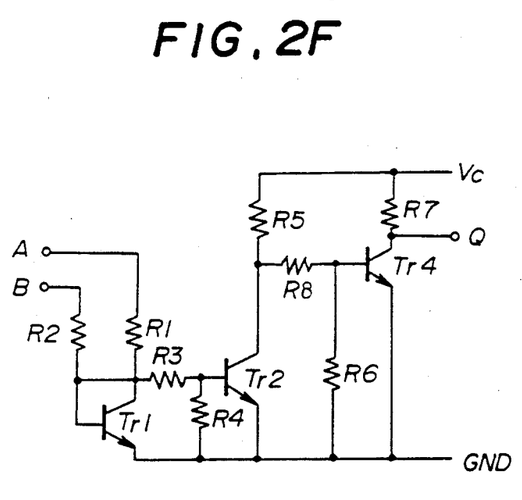

FIG. 2F is a circuit diagram of the non-inverted-output type, two-input state hold circuit. In FIG. 2F, those parts which are the same as those shown in FIG. 2C are given the same reference numerals. As shown in FIG. 2F, a transistor Tr4 and three resistors R6, R7 and R8 are added to the circuit configuration shown in FIG. 2C. The resistor R6 is connected between the base and emitter of the transistor Tr4. The resistor R7 is connected to the collector of the transistor Tr4 and the high-potential side power supply line Vc. The resistor R8 is connected between the collector of the transistor Tr2 and the base of the transistor Tr4. The collector of the transistor Tr4 forms the output terminal Q. It is possible to omit the resistors R6 and R8 if the transistor Tr2 can turn OFF the transistor Tr4.

It is also possible to form the edge triggered flip-flop by using a multi-input state hold circuit having three or more input terminals. More specifically, the multi-input state hold circuit has N input terminals (N is an integer), outputs a low-level (or high-level) output signal when the number of input signals which have the high levels is smaller than a threshold value N1, outputs a high-level (or low-level) output signal when the number of input signals which have the high levels is larger than a threshold value N2, and holds the previous state when the number of input signals which have the high levels is between the threshold values N1 and N2 where $0 < N1 \leq N2 < N$. The above multi-input state hold circuit can be configured by simply adding input terminals (resistors) to the aforementioned two-input state hold circuit. The threshold values N1 and N2 are determined, based on the load lines and the negative conductance element (diode or diode-connected transistor). If the four-input state hold circuit has two stable points only when the number of high-level input signals is equal to 2, N is equal to 4, and each of the threshold values N1 and N2 is equal to 2.

Figure 6A:
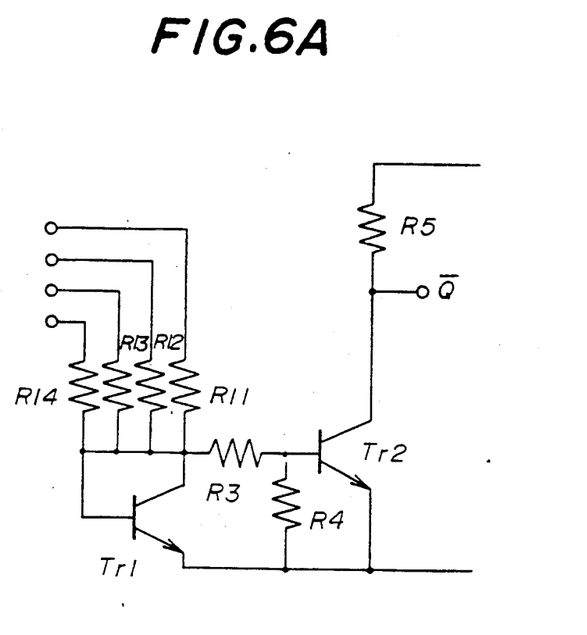
FIG. 6A is a circuit diagram of another state hold circuit used in the present invention.
Figure 6B:
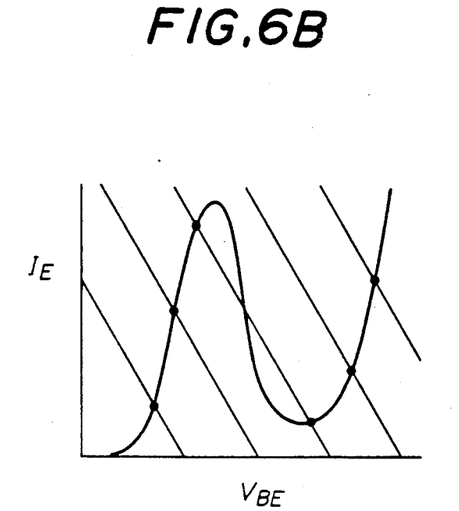
FIG. 6B is a graph of an emitter current vs base-emitter voltage of a diode-connected transistor shown in FIG. 6A.

FIG. 6A is a circuit diagram of such a four-input state hold circuit, and FIG. 6B is a graph showing an $I_E$-$V_{BE}$ characteristic of the transistor Tr1 shown in FIG. 6A and five load lines. Four input terminals are coupled to the base of the diode-connected transistor Tr1 via resistors R11, R12, R13 and R14. The four-input state hold circuit, which satisfies the condition that N=4 and N1=N2=2, operates as the two-input state hold circuit by applying a high-level signal to one of the four input terminals and applying a low-level signal to another one of the four input terminals. The remaining two input terminals function as two input terminals of the two-input state hold circuit.

Figure 7:
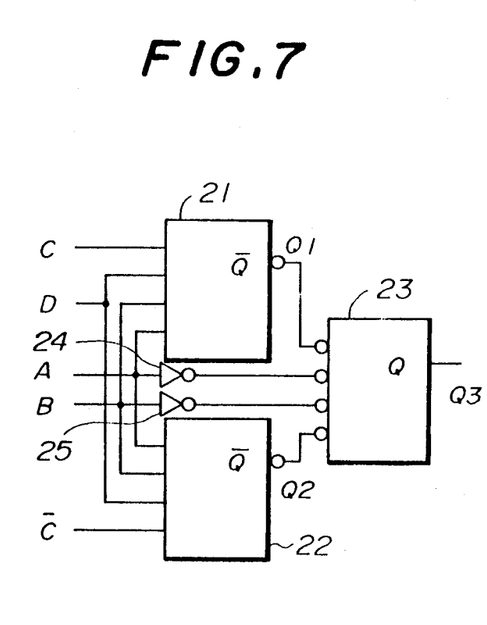
FIG. 7 is a block diagram of a second preferred embodiment of the present invention.

FIG. 7 shows an inverted-output type, four-input state hold circuit which functions as inverted-output type two-input state hold circuit. The circuit shown in FIG. 7 is composed of three inverted-output type four-input state hold circuits 21, 22 and 23, and two inverters 24 and 25. Input (control) signals A and B, which are applied to the state hold circuits 21 and 22 in common, are maintained at the high and low levels (or vise versa). The clock signal C is applied to one of the remaining two input terminals of the state hold circuit 21, and the data signal D is applied to the other input terminal thereof. The inverted clock signal /C is applied to one of the remaining two input terminals of the state hold circuit 22, and the data signal D is applied to the other input terminal thereof. Inverted versions of the input signals A and B, obtained via the inverters 24 and 25, respectively, are applied to two of the four input terminals of the state hold circuit 23. An output signal Q1 of the state hold circuit 21 and an output signal Q2 of the state hold circuit 22 are applied to the remaining two input terminals of the state hold circuit 23. An output signal Q3 of the state hold circuit 23 is an output signal of the sequential logic circuit (edge triggered D-type flip-flop circuit) shown in FIG. 7. As has been described, the circuit shown in FIG. 7 functions as the edge triggered type flip-flop by setting the input signals A and B to be high and low (or vice versa).

Figure 8:
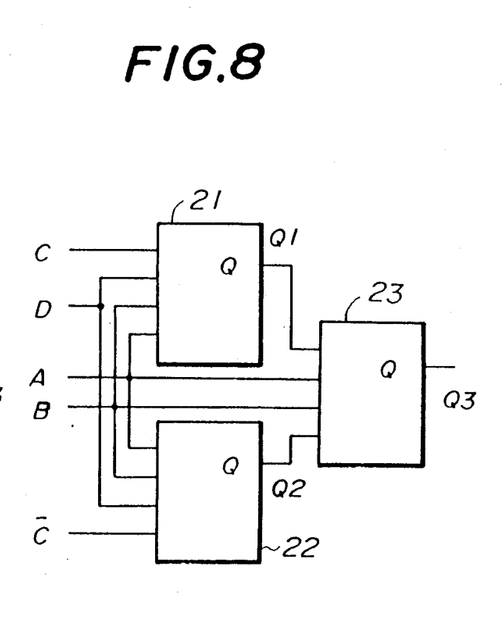
FIG. 8 is a block diagram of a variation of the second preferred embodiment of the present invention shown in FIG. 7.

FIG. 8 shows a variation of the circuit shown in FIG. 7. In the variation shown in FIG. 8, non-inverted output type, four-input state hold circuits are used instead of the inverted-output type, four-input state hold circuits used in FIG. 7. The non-inverted output type, four-input state hold circuit can be obtained by adding a transistor in the same way as shown in FIG. 2F. The inverters 24 and 25 shown in FIG. 7 are not used in the circuit configuration shown in FIG. 8.

In the circuit configuration shown in FIG. 7 or FIG. 8, it is possible to use the input signals A and B which have identical levels (high or low). In this case, either the clock signal C or the inverted clock signal /C has the same level as the input signals A and B. Thus, at least one of the state hold circuits 21 and 22 receives at least three input signals which have the same logic levels as the input signal A, and its output signal (Q1 or Q2) is /A (FIG. 7) or A (FIG. 8). Hence, the output signal Q3 is A because at least three input signals of the state hold circuit 23 are each /A (FIG. 7) or A (FIG. 8). It can be seen from the above that the flip-flop is asynchronously set to the logic level to which the input signals A and B are also set. Thus, a D-type flip-flop with an asynchronous input terminal can be obtained. In this manner, it becomes possible to provide the D-type flip-flop with an additional function.

The present invention can be applied to a shift register, a n-nary counter (n is an integer) or the like.

Figure 9A:
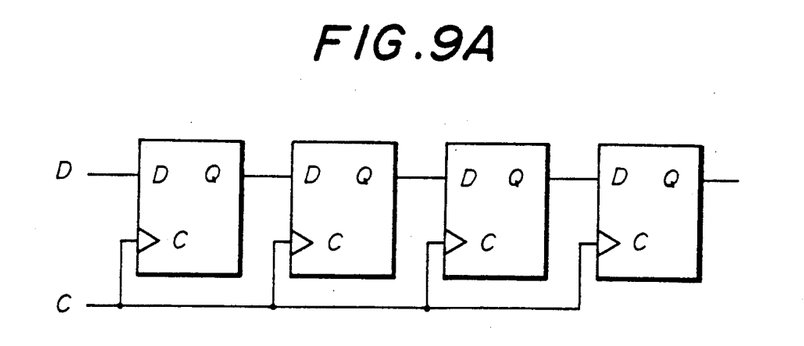
FIGS. 9A, 9B and 9C are block diagrams of applications of the present invention.
Figure 9B:
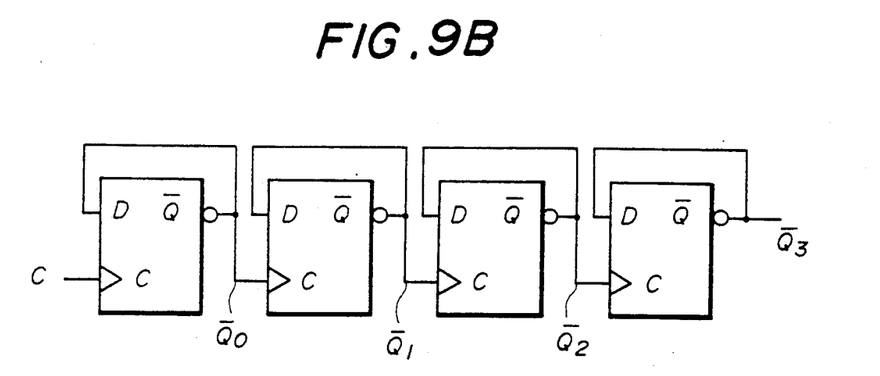
Figure 9C:
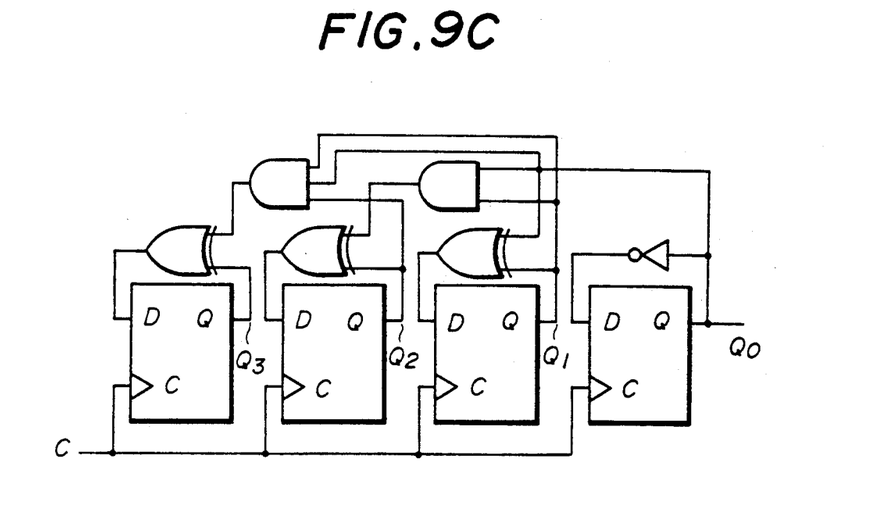

FIG. 9A shows a shift register composed of a plurality of cascaded D-type flip-flops. FIG. 9B shows a ripple carry type 16-nary counter. FIG. 9C shows a synchronous type 16-nary counter.

It is possible to form the state hold circuit with elements other than the combination of the RHETs and resistors. For example, a resonant tunneling bipolar transistor can be used. In another example, a combination of a transistor and a two-terminal negative conductance element, such as a resonant-tunneling diode or an Esaki diode, can be used. It is also possible to obtain the hysteresis effect by means of a positive feedback circuit, such as one in which a Schmitt trigger gate is used. The resistors R1-R4 and R11-R14 can be replaced with other level shift elements. It is also possible to form each state hold circuit with a three-input majority decision circuit or a non-inverting amplifier (or buffer gate).

The present invention is not limited to the specifically disclosed embodiments, and variations and modifications may be made without departing from the scope of the present invention.

What is claimed is:

1. A sequential logic circuit comprising:
    first, second and third state hold circuits, each having a first input terminal, a second input terminal and an output terminal, the first input terminal of the first state hold circuit receiving a clock signal, the second input terminal of the first state hold circuit and the first input terminal of the second state hold circuit receiving a data signal, the second input terminal of the second state hold circuit receiving an inverted clock signal corresponding to an inverted version of the clock signal, the output terminal of the first state hold circuit and the output terminal of the second state hold circuit being connected to the first and second input terminals of the third state hold circuit, respectively, and an output signal of the sequential logic circuit being output via the output terminal of the third state hold circuit; and
    each of the first, second and third state hold circuits having the following truth table:

| A | B | Qn+1 |
|---|---|------|
| 0 | 0 | 1 or 0 |
| 0 | 1 | Qn |
| 1 | 0 | Qn |
| 1 | 1 | 0 or 1 | where A and B are signals applied to the first and second input terminals, respectively, and Qn and Qn+1 are respectively signals obtained at the output terminal,
    the sequential logic circuit inputting the data signal only when the clock signal changes.

2. A sequential logic circuit as claimed in claim 1, wherein each of the first, second and third state hold circuits comprises an element having a negative conductance.

3. A sequential logic circuit as claimed in claim 1, wherein:
    each of the first, second and third state hold circuits comprises a first transistor having a negative conductance, a first level shift element and a second level shift element, said first transistor having a collector, an emitter and a base;

the first input terminal is coupled to the base via the first level shift element;

the second input terminal is coupled to the base via the second level shift element;

the collector is connected to the base; and the emitter receives a first predetermined voltage.

4. A sequential logic state circuit as claimed in claim 3, wherein:

each of said first, second and third state hold circuits comprises a second transistor, a third level shift element, a fourth level shift element, and a load resistor, said second transistor having a collector, a base and an emitter;

the base of the second transistor is coupled to the collector of the first transistor via the third level shift element, and receives the first predetermined voltage via the fourth level shift element;

the emitter receives the first predetermined voltage;

the collector receives a second predetermined voltage via the load resistor; and an amplified version of the output signal produced at the collector of the first transistor is produced at the collector of the second transistor.

5. A sequential logic circuit as claimed in claim 1, wherein:

each of said first, second and third state hold circuits comprises third and fourth input terminals;

the third input terminal of the first state hold circuit and the fourth input terminal of the second state hold circuit receive a first predetermined signal;

the fourth input terminal of the first state hold circuit and the third input terminal of the second state hold circuit receive a second predetermined signal having a logic level different from that of the first predetermined signal; and the third and fourth terminals of the third state hold circuit respectively receive inverted versions of the first and second predetermined signals.

6. A sequential logic circuit as claimed in claim 1, wherein:

each of said first, second and third state hold circuits comprises third and fourth input terminals;

the third input terminal of the first state hold circuit and the fourth input terminal of the second state hold circuit receive a first predetermined signal;

the fourth input terminal of the first state hold circuit and the third input terminal of the second state hold circuit receive a second predetermined signal having a logic level identical to that of the first predetermined signal; and the third and fourth terminals of the third state hold circuit respectively receive the first and second predetermined signals.

7. A sequential logic circuit comprising:

first, second and third state hold circuits, each having N input terminals where N is an integer, and an output terminal, N input signals being respectively applied to the N input terminals, each of the first, second and third state hold circuits:

generating a first-level output signal when the number of predetermined-logic-level input signals among the N input signals is smaller than a threshold value N1;

generating a second-level output signal when the number of predetermined-logic-level input signals, among the N input signals, is larger than a threshold value N2; and holding a previous logic state of the output signal when the number of predetermined-logic-level input signals, among the N input signals, is between the threshold values N1 and N2 where $0 \leq N1 \leq N2 < N$, and wherein:

two of the N input terminals of the first state hold circuit receive a clock signal and a data signal, respectively;

two of the N input terminals of the second state hold circuit receive an inverted version of the clock signal and the data signal, respectively;

(N−2) of the N input terminals of the first state hold circuit receive first control signals;

(N−2) of the N input terminals of the second state hold circuit receive second control signals;

two of the N input terminals of the third state hold circuit are connected to the output terminals of the first and second state hold circuits;

(N−2) of the N input terminals of the third state hold circuit receive third control signals; and an output signal of the sequential logic circuit is output via the output terminal of the third state hold circuit.

8. A sequential logic circuit as claimed in claim 7, wherein the second control signals are identical to the first control signals and the third control signals are inverted or non-inverted versions of the first control signals.

9. A sequential logic circuit as claimed in claim 7, wherein:

N is equal to 4;

a first predetermined signal and a second predetermined signal are included in the first control signals;

the first and second predetermined signals are applied to two of the four input terminals of each of the first and second state hold circuits;

said sequential logic circuit further comprises inverter means for generating inverted versions of the first and second predetermined signals; and the inverted versions of the first and second predetermined signals are applied to two of the four input terminals of the third state hold circuit.

10. A sequential logic circuit as claimed in claim 9, wherein the first predetermined signal has a logic level different from that of the second predetermined signal.

11. A sequential logic circuit as claimed in claim 7, wherein:

N is equal to 4;

a first predetermined signal and a second predetermined signal are included in the first control signals; and the first and second predetermined signals are applied to two of the four input terminals of each of the first, second and third state hold circuits.

12. A sequential logic circuit as claimed in claim 7, wherein N is equal to 4, N1 is equal to 2 and N2 is equal to two.

13. A sequential logic circuit as claimed in claim 7, wherein:

each of the first, second and third state hold circuits comprises a first transistor having a negative conductance, and N resistors, said first transistor having a collector, an emitter and a base;

the N input terminals are respectively coupled to the base via the N resistors;

the collector is connected to the base; and the emitter receives a first predetermined voltage.

14. A sequential logic state circuit as claimed in claim 13, wherein:

each of said first, second and third state hold circuits comprises a second transistor, a first level shift resistor, a second level shift resistor, and a load resistor, said second transistor having a collector, a base and an emitter;

the base of the second transistor is coupled to the collector of the first transistor via the first level shift element resistor, and receives the first predetermined voltage via the level shift element;

the emitter receives the first predetermined voltage;

the collector receives a second predetermined voltage via the load resistor; and an amplified version of the output signal produced at the collector of the first transistor is produced at the collector of the second transistor.

15. A sequential logic circuit as claimed in claim 7, wherein:

each of the first, second and third state hold circuits comprises a diode having a negative conductance, N resistors, said diode having an anode and a cathode;

the N input terminals are respectively coupled to the anode of the diode via the N resistors; and the cathode of the diode receives a predetermined voltage.

* * * * *

UNITED STATES PATENT AND TRADEMARK OFFICE
CERTIFICATE OF CORRECTION

PATENT NO. : 5,221,866
DATED : June 22, 1993
INVENTOR(S) : TAKATSU

It is certified that error appears in the above-indentified patent and that said Letters Patent is hereby corrected as shown below:

Col. 2, line 35, delete ":".

Col. 3, line 51, change "volta" to --voltage--;
line 52, change "volta" to --voltage--.

Signed and Sealed this

Twenty-first Day of June, 1994

Attest:

BRUCE LEHMAN

*Attesting Officer*     *Commissioner of Patents and Trademarks*